(12) United States Patent
Hou

(10) Patent No.: US 7,192,800 B2
(45) Date of Patent: Mar. 20, 2007

(54) METHOD TO CHANGE THE PROFILES OF RELEASED MEMBRANES

(76) Inventor: Jidong Hou, Room 102, building 179, Lane 1088, Xinnan Road, Songjiang District, Shanghai (CN) 201612

( * ) Notice: Subject to any disclaimer, the term of this patent is extended or adjusted under 35 U.S.C. 154(b) by 184 days.

(21) Appl. No.: 10/952,757

(22) Filed: Sep. 30, 2004

(65) Prior Publication Data

US 2005/0079648 A1   Apr. 14, 2005

Related U.S. Application Data

(60) Provisional application No. 60/509,234, filed on Oct. 8, 2003.

(51) Int. Cl.
*H01L 21/302* (2006.01)

(52) U.S. Cl. .................................................. 438/53

(58) Field of Classification Search ............. 438/50, 438/52, 53, 57
See application file for complete search history.

(56) References Cited

U.S. PATENT DOCUMENTS

| | | | |
|---|---|---|---|
| 7,053,737 B2 * | 5/2006 | Schwartz et al. | 335/78 |
| 7,057,251 B2 * | 6/2006 | Reid | 257/432 |
| 2003/0031221 A1 * | 2/2003 | Wang et al. | 372/45 |
| 2004/0066258 A1 * | 4/2004 | Cohn et al. | 335/78 |
| 2004/0252936 A1 * | 12/2004 | Despont et al. | 385/18 |
| 2005/0130360 A1 * | 6/2005 | Zhan et al. | 438/197 |
| 2005/0226281 A1 * | 10/2005 | Faraone et al. | 372/20 |

* cited by examiner

*Primary Examiner*—M. Wilczewski

(57) ABSTRACT

A method to change the profile of released membranes is disclosed. This method is to form an island structure at certain regions of membranes. Membranes comprise one or several layers of different materials, and at least one layer has intrinsic or residual stress. The profile of membrane will change from being flat to curved at the region of island structure when membranes are released from sacrificial layers.

10 Claims, 1 Drawing Sheet

METHOD TO CHANGE THE PROFILES OF RELEASED MEMBRANES

This Application claims a priority date of Oct. 8, 2003 benefited from a previously filed Provisional Patent Application 60/509,234 filed on Oct. 8, 2003 by the Applicants of this Formal Patent Application.

CROSS-REFERENCE TO RELATED APPLICATIONS

Not Applicable

STATEMENT REGARDING FEDERALLY SPONSORED RESEARCH OR DEVELOPMEMT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

Released membranes are usually used as moving parts in MEMS. The membranes are formed on sacrificial layers. When the sacrificial layers are etched away, membranes are released. The released membranes can move by deflection, and they often act as functional parts in MEMS (micro electro mechanic system). For example, they can have high reflectivity, acting as mirrors. In some applications of MEMS, such as optical filter, released membranes need some kinds of profiles, such as convex or concave surfaces, instead flat ones to perform well. The deflection by outside force will change the profile of released membranes, but the curvatures vary with deflection and usually the curvatures radii are very large. Compressive stress can be introduced on the membranes, leading a bow profile of membranes. Compressive stress will make membranes not easy to be released and the curvatures will vary with deflection. This method can not make surfaces with small curvature radii.

U.S. Pat. No. 6,768,756 gives a method to make curved membranes. In that patent, patterned photo resist is reflowed to make curved surface and this curved surface is transferred to a device layer by etching and membranes having optical properties are coated on the device layer. The device layer must be thick enough for forming curved surfaces. The membrane is attached to the device layer. Therefore, very large driving force is needed to move membranes. And some more optical membranes will be needed to eliminate the effect of the device layers if light pass through them.

BRIEF SUMMARY OF THE INVENTION

The present invention discloses a method to change the profiles of released membranes. Curved surface on released membrane can be made by this method. This method introduces island structures on released membranes. Before being released, the island structures are top-hat regions of membranes. The materials of the island structures can be the same as the other part of the membrane or different from that. The membranes comprise one layer or several layers of different materials. At least one layer has intrinsic or residual stress. Because of the island structures, local strain can be introduced, and the surface of the island structures will change from being flat. The shape of the island structures can be round, square or any arbitrary one. This method has following advantages compared with previous ones: 1) The whole stress of membrane can still be tensile. Therefore, the releasing of membranes is easier than that having compressive stresses. 2) The curvature radii of the membranes at island region can be very small by adjusting the geometric parameters or material properties of the island structures. 3) The curvature of island region will not change or change very little when the whole parts of membranes deflect. 4) Since it is not attached to a thick device layer, the membrane is sensitive to diving force. If electrostatic forces are adopted, the corresponding driving voltages can be decreased.

BRIEF DESCRIPTION OF THE SEVERAL VIEWS OF THE DRAWING

The accompany drawings are not necessarily in scale, they just be used to illustrate the principles of this invention.

DETAILED DESCRIPTION OF THE INVENTION

Figure 1A:
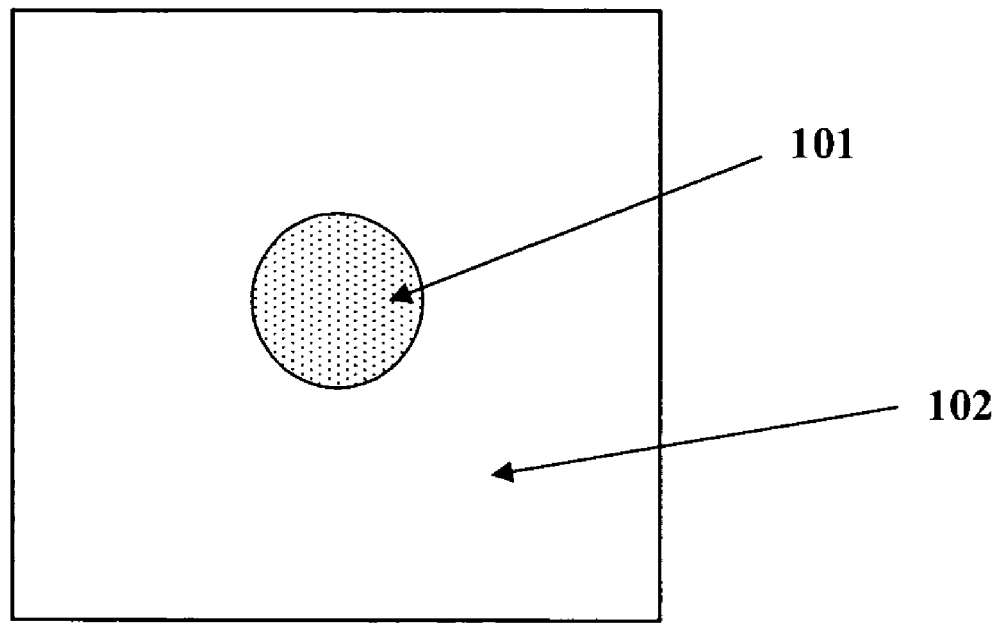
FIG. 1a shows the island structure of this invention on membranes.
Figure 1B:
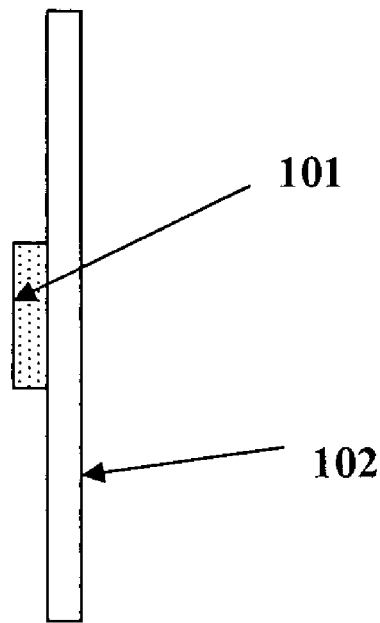
FIG. 1b is schematic cross section view of this island structure

FIG. 1a and FIG. 1b shows an embodiment of island structure. The process for making island structures on released membranes is conventional. At First, a sacrificial layer is deposited on a substrate. Then a membrane is deposited on the sacrificial layer. The membrane can comprise layers of different materials, such as polysilicon, amorphous silicon, nitride, silicon dioxide and SiC. Polysilicon or amorphous silicon can be used together with nitride as high and low reflectivity layers, respectively. Metals, such as aluminum and gold, can also be deposited on the membrane. At least one layer of the membrane has intrinsic or residual stress. The stress of these layers can be adjusted by the conditions of deposition. Then photo resist is coated on the membrane, and is patterned to leave the photo resist at the place where the island structure will be made. At the region without the protection of photo resist, at least one layer is partly etched thinner or etched away by wet etching or dry etching, but still at least one layer or a part of layer remain. Then, photo resist is peeled off, and the sacrificial layer is selectively etched away around the region of island structure. The released region of membrane is larger than the area of island, and the island structure is a part of the released membrane. Some holes can be made around the island structure on the membrane to etch the sacrificial layer. The released membrane can be round or square. When electrostatic force or liquid/air pressure is applied on membrane, the whole released membrane will deflect. Usually the island is at the center of the released membrane. FIG 1a shows a round island structure, 101 is the island structure. 102 is the membrane under island structure, which is supported by the left of the sacrificial layer. FIG. 1b shows the cross section view of the island structure. The shape of island can be also square or any shape. Generally, the layer(s) of 102 has (have) tensile stress, so it is easy for releasing of membrane. The layer(s) in the 101 island structure can have compressive or tensile stress. When the membrane is released, the profile of membrane at the island region will change from being flat. Generally, a round island will lead to a convex or concave surface. Other shapes of island will lead to more complex surface. The thickness distribution of the layers will affect the curvature of the island structure.

I claim:

1. A method to change the profile of a released membrane, the method comprising forming an island structure on said membrane to make said membrane have a top-hat profile in cross section view before said membrane is released, said island structure corresponding to the protruding portion of said top-hat profile, said membrane comprising at least one layer of materials having intrinsic or residual stress;

Wherein said method changes the profile of the surface of said island structure from being flat due to the introducing of local strain by said island structure after said membrane is released, and said island structure is in the released area of said membrane.

2. A method as claimed in claim 1, wherein said membrane is deposited on a sacrificial layer, and a protecting layer is patterned on said membrane before said membrane is released, and the region of said membrane without said protecting layer is etched thinner by wet etching or dry etching before said membrane is released, and the region of said membrane with said protecting layer forms said island structure, and said protecting layer is peeled off after said etching.

3. A method as claimed in claim 2, wherein said membrane comprises alternate layers of nitride and polysilicon or of nitride and amorphous silicon.

4. A method as claimed in claim 3, wherein said layers of said membrane are deposited by LPCVD, PECVD, and the stress of said layers is controlled by the conditions of deposition.

5. A method as claimed in claim 2, wherein said membrane comprises layer(s) of materials of the following: nitride, polysilicon, amorphous silicon, silicon dioxide, SiC, aluminum and gold.

6. A method as claimed in claim 5, wherein said layers of said membrane are deposited by LPCVD, PECVD, sputtering or evaporating method, and the stress of said layers is controlled by the conditions of deposition.

7. A method as claimed in claim 2, further comprising etching some holes though said membrane for selective etching of said sacrificial layer.

8. A method as claimed in claim 7, wherein said sacrificial layer is selectively etched and said island structure is at the center of the released area of said membrane.

9. A method as claimed in claim 2, wherein said protecting layer is photoresist.

10. A method as claimed in claim 2, wherein said island structure has a round shape, and the radii of the curvature of said membrane at said island region after said membrane is released is controlled by the stress of said layer(s), the geometric parameters of said island structure, the material properties of said island structure and the thickness distribution of said layers.

* * * * *